(12) United States Patent
Chidambarrao et al.

(10) Patent No.: US 9,311,443 B2
(45) Date of Patent: Apr. 12, 2016

(54) CORRECTING FOR STRESS INDUCED PATTERN SHIFTS IN SEMICONDUCTOR MANUFACTURING

(71) Applicant: GLOBALFOUNDRIES INC., Grand Cayman (KY)

(72) Inventors: Dureseti Chidambarrao, Weston, CT (US); James A. Culp, Newburgh, NY (US); Paul C. Parries, Beacon, NY (US); Ian P. Stobert, Hopewell Junction, NY (US)

(*) Notice: Subject to any disclaimer, the term of this patent is extended or adjusted under 35 U.S.C. 154(b) by 0 days.

(21) Appl. No.: 14/306,715

(22) Filed: Jun. 17, 2014

(65) Prior Publication Data

US 2015/0363536 A1    Dec. 17, 2015

(51) Int. Cl.
G06F 17/50    (2006.01)

(52) U.S. Cl.
CPC .................................. G06F 17/5081 (2013.01)

(58) Field of Classification Search
CPC ....................................................... G03F 1/144
USPC .......................................................... 716/53
See application file for complete search history.

(56) References Cited

U.S. PATENT DOCUMENTS

| 7,007,265 | B2 | 2/2006 | Mori |
| 7,032,194 | B1* | 4/2006 | Hsueh et al. ..................... 716/53 |
| 7,996,813 | B2 | 8/2011 | Hatano et al. |
| 8,095,907 | B2* | 1/2012 | Bickford et al. ............. 716/136 |
| 8,103,983 | B2 | 1/2012 | Agarwal et al. |
| 8,260,449 | B2 | 9/2012 | Chung |
| 8,352,886 | B2 | 1/2013 | Laske et al. |
| 8,589,828 | B2 | 11/2013 | Lee et al. |
| 2004/0060033 | A1* | 3/2004 | Kamon ........................... 716/19 |
| 2004/0210863 | A1* | 10/2004 | Culp et al. ....................... 716/21 |
| 2005/0251771 | A1* | 11/2005 | Robles .............................. 716/5 |
| 2010/0122231 | A1* | 5/2010 | Agarwal et al. ................. 716/19 |
| 2010/0242002 | A1* | 9/2010 | Sekiguchi .......................... 716/4 |
| 2010/0257493 | A1* | 10/2010 | Agarwal et al. ................... 716/4 |

(Continued)

OTHER PUBLICATIONS

Martinick et al., "Scanner and stepper intrafield distortion characterization: a comparison and correlation of current techniques", Proc. SPIE 4344, Metrology, Inspection, and Process Control for Microlithography XV, 623 (Aug. 22, 2001), pp. 1-2.

(Continued)

Primary Examiner — Suresh Memula
(74) Attorney, Agent, or Firm — Scully Scott Murphy and Presser

(57) ABSTRACT

Apparatus, method and computer program product for reducing overlay errors during a semiconductor photolithographic mask design process flow. The method obtains data representing density characteristics of a photo mask layout design; predicts stress induced displacements based on said obtained density characteristics data; and corrects the mask layout design data by specifying shift movement of individual photo mask design shapes to pre-compensate for predicted displacements. To obtain data representing density characteristics, the method merges pieces of data that are combined to make a photo mask to obtain a full reticle field data set. The merge includes a merge of data representing density characteristic driven stress effects. The density characteristics data for the merged reticle data are then computed. To predict stress-induced displacements, the method inputs said density characteristics data into a programmed model that predicts displacements as a function of density, and outputs the predicted shift data.

21 Claims, 3 Drawing Sheets

(56) References Cited

U.S. PATENT DOCUMENTS

| | | | |
|---|---|---|---|
| 2010/0269079 A1* | 10/2010 | Banerjee et al. | 716/5 |
| 2012/0117519 A1* | 5/2012 | Parikh | 716/53 |
| 2013/0219350 A1* | 8/2013 | Lee et al. | 716/54 |
| 2013/0330847 A1 | 12/2013 | Tsai et al. | |

OTHER PUBLICATIONS

Hebb et al., "The Effect of Patterns on Thermal Stress During Rapid Thermal Processing of Silicon Wafers", IEE Transactions on Semiconductor Manufacturing, Vol. 11, No. 1, Feb. 1998 pp. 99-107.

Sasso et al., "Finite element analysis of surface-stress effects in the Si lattice-parameter measurement", Abstract, Cornell University Library, submitted Feb. 19, 2013.

Stiffler et al., "The Effect of Trench Corner Shapes on Local Stress Fields: A Three-Dimensional Finite-Element Modeling Study", IEEE Transactions on Electron Devices, vol. 40, No. 3, Mar. 1993, pp. 557-563.

Millik et al., "Simulation of Process-Stress Induced Warpage of Silicon Wafers Using ANSYS® Finite Element Analysis", 43rd International Symposium on Microelectronics Oct./Nov. 2010, IMAPS 2010, pp. 364-371.

Dhumal et al., "A Theoretical and Experimental Study of Stresses Responsible for the SOI Wafer Warpage", ECS Trans. Oct. 2008 vol. 16, issue 6, 57-62.

Dao et al., "Through-Silicon-Via Stress 3D Modeling and Design", IC Design and Technology (ICICDT), 2010 IEEE International Conference on, Jun. 2-4, 2010, pp. 114-117.

* cited by examiner

CORRECTING FOR STRESS INDUCED PATTERN SHIFTS IN SEMICONDUCTOR MANUFACTURING

FIELD OF INVENTION

This disclosure relates generally to the manufacture of semiconductor chips devices and structures, and a novel system and method to correct for stress induced pattern shifts and distortions in semiconductor manufacturing such as by correcting for localized overlay errors by correcting mask data during the mask data processing flow.

BACKGROUND

Stress impacts the performance of semiconductor devices by altering the band structure of the semiconductor material, and consequently, the mobility of carriers. This effect is prominent in many semiconductor devices, e.g., metal-oxide-semiconductor field effect transistor (MOSFET) devices. For example, minority carriers in the body, e.g., hole mobility of a p-type MOSFET, formed on a silicon substrate increases under a uniaxial compressive stress in the direction of the channel, i.e., along a line connecting the source and the drain, thereby impacting transconductance of a MOSFET. The electron mobility of an n-type MOSFET formed on a silicon substrate increases under a tensile stress in the direction of the channel. The change in the mobility of minority carriers depends on the type and direction of stress as well as the semiconductor substrate material.

As a physical quantity, stress is defined at every point in a semiconductor device as a three-dimensional tensor, thus forming a tensor field within a semiconductor structure. Since the stress is generated by physical structures, variations in the arrangement in the physical structures around the semiconductor device results in variations in the stress. Thus, accurate modeling of semiconductor devices requires modeling of the effects of stress on semiconductor devices.

Methods of modeling stress in semiconductor devices for device modeling and circuit simulation purposes are known.

As stress effects in silicon processing cause displacements in the silicon lattice in intermediate stages of silicon processing, these displacements may cause overlay error between mask layers.

For example, during the manufacture of embedded DRAM layouts, there can be overlay errors between DT and RX shapes (where DT is a deep trench and RX recessed oxide), induced during the annealing of deep trench structures. Signature of overlay errors exhibit strong correlation to DT pattern density gradients.

The displacement of DT shapes was related to stress and it is recognized that stress can be the source of systematic, within-field overlay error.

Similar issues have been observed in fin-FET eDRAM devices. For example, in a fin-FET eDRAM, overlay errors between trenches and fins have been observed and the errors correlate highly to DT density gradients. The observed overlay error did not meet the required tolerances.

Currently, as an annealing step may be a cause of induced stress, one possible solution is to reduce stress. Process modifications were looked at as a means to reduce stress, but eliminating the stress completely may not be possible. Another method to address the problem is to try to improve the design uniformity through the reticle field (via dummy fill, design rules, etc. . . . ). This is a commonly applied technique, but the inability to place DT (deep trenches) in some areas of logic and SRAM (under non-eDRAM devices) prevents this from being a completely successful mitigation technique.

SUMMARY

A system and method for the manufacturing of semiconductor chips, devices and structures which includes modeling expected overlay (either empirically, analytically or with physical models), and then based on the model predictions, correcting mask shapes to pre-compensate for any errors.

In one aspect, the system and method models stress induced displacements based on knowledge of density characteristics of layout. This model is then used to correct mask data by moving individual shapes in the mask data in a manner to pre-compensate for expected shifts.

In one aspect, a method of reducing overlay errors during a semiconductor photolithographic mask design process flow is described. The method comprises: obtaining data representing density characteristics of a photo mask layout design; predicting stress induced displacements based on the obtained density characteristics data; and correcting the mask layout design data by specifying shift movement of individual shapes indicated in a mask data set to compensate for predicted displacements. A programmed hardware processor performs the obtaining, stress predicting and mask layout design correcting.

There is further provided a system for designing semiconductor photolithographic masks comprising: a memory storage device; a hardware processor, coupled to the memory storage device, for receiving instructions therefrom to configure the hardware processor to perform a method comprising: obtaining data representing density characteristics of a photo mask layout design; predicting stress induced displacements based on the obtained density characteristics data; and correcting the mask layout design data by specifying shift movement of individual shapes indicated in a mask data set to compensate for predicted displacements. A programmed hardware processor performs the obtaining, stress predicting and mask layout design correcting.

In a further aspect, a computer program product is provided for performing operations. The computer program product includes a storage medium readable by a processing circuit and storing instructions run by the processing circuit for running a method. The method is the same as listed above.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION

The present disclosure describes a system and method for reducing overlay error by 1) modeling stress induced displacements based on knowledge of density characteristics of layout, and 2) using this model to correct mask data by moving individual shapes in the mask data in a manner to pre-compensate for expected shifts.

As one embodiment of method there is performed steps that: 1) perform a reticle merge where density characteristic driven stress effect are merged into a full reticle field data set; 2) compute density data for the merged reticle data; 3) use density data as an input into a model that may predict displacements as a function of density; 4) convert predicted shift data into layout marker data; 5) merge shift marker data back into layout data thereby effectively annotating the layout with prescribed shifts for each small sub-region of the field; and 6) run annotated data through a modified OPC recipe or mask fracture process that are designed to apply displacements to the mask shapes to pre-compensate for the stress induced displacements.

The net result is the altering of a mask "tape out" flow to improve within-field overlay errors and further using data prepared for (OPC) and the part of the flow to do the mask correction to address overlay errors.

Figure 1:
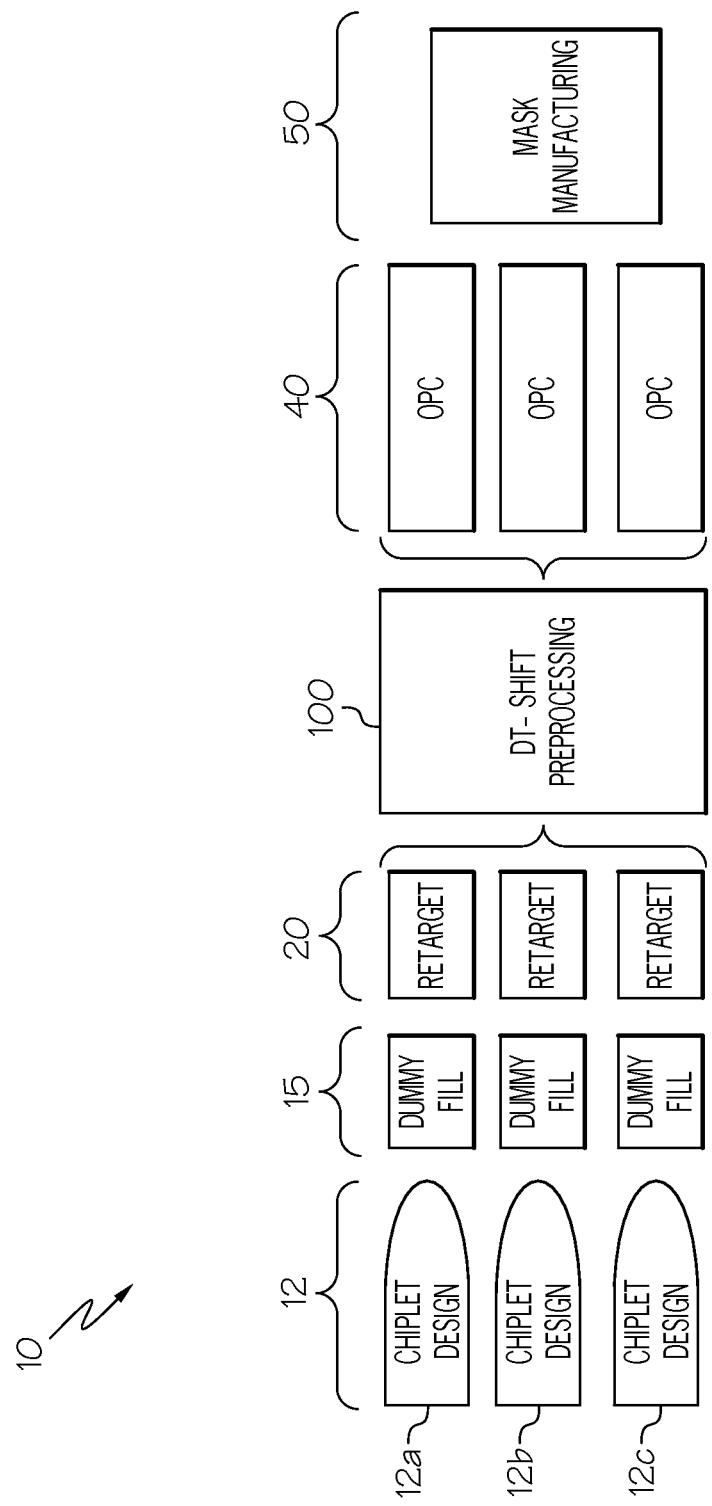
FIG. 1 shows an example "tape out" flow and the data processing steps 10, for building a single mask for semiconductor layer design in one embodiment.

FIG. 1 shows an example "tape out" flow, i.e., the data processing steps 10, for building a single mask for semiconductor layer design such as deep trench hole features (e.g., as used in eDRAM semiconductor chips).

In the example "tape out" flow 10 depicted in FIG. 1, the mask design 12 may be broken into sub-design regions, shown as chiplet designs 12 (e.g., chiplets 12a, 12b, 12c) to avoid processing an entire reticle field at once. This example flow 10 is oriented to producing an DT mask (for example, for an eDRAM) where stress effects due to a DT manufacture are most pronounced). It is understood that this steps herein may be further part of a larger hierarchical flow. A next dummy fill step 15 is performed which is a topography fill where shapes are added to provide a layout for pattern uniformity in an effort to avoid topography problems. This dummy fill step may be performed on a localized, i.e., chiplet by chiplet, basis for each chiplet 12a, 12b, 12c. These designs accounting for topographic corrections, are next processed in a typical retargeting step 20, on a localized, i.e., chiplet by chiplet, basis. The method then employs the method for DT shift 100 as described herein with respect to FIG. 2. As will be described in relation to FIG. 2, this method addresses the localized (within reticle field) overlay errors and variation, i.e., pattern distortions, such as caused by issues like stress. The method, in one embodiment, enables a move (e.g., a shifting) of individual mask polygons to account for the predicted overlay errors, for example, after/during an Optical Proximity Correction (OPC) step 40, resulting in a good correspondence between moving the mask shapes and resulting features on the wafer. Performing the shifting of mask shapes to correct for stress may be implemented before OPC or after OPC, or during the mask data processing. The sum of the processing results obtained for each chiplet are eventually merged are to build the resulting mask at step 50 corresponding to a Release to Mask Out, i.e., Mask Build step.

Further to the processing flow above, it is understood that if the DT level mask (having a stress problem) is the nth level mask, of X levels (X>>n) of chip mask design, it is understood that all the layers at that level and below would have to be aligned. Thus, the tape out flow at that level and for those levels below would have to be modified to include the method 100 of FIG. 2 to address/improve within-field overlay errors. In another embodiment, the same techniques could be used to account for stress effects that are induced between the processing of any two mask levels, but the resulting corrections become more complex as shapes on many mask layers may need to be adjusted to compensate for the stress-induced misalignments.

Figure 2:
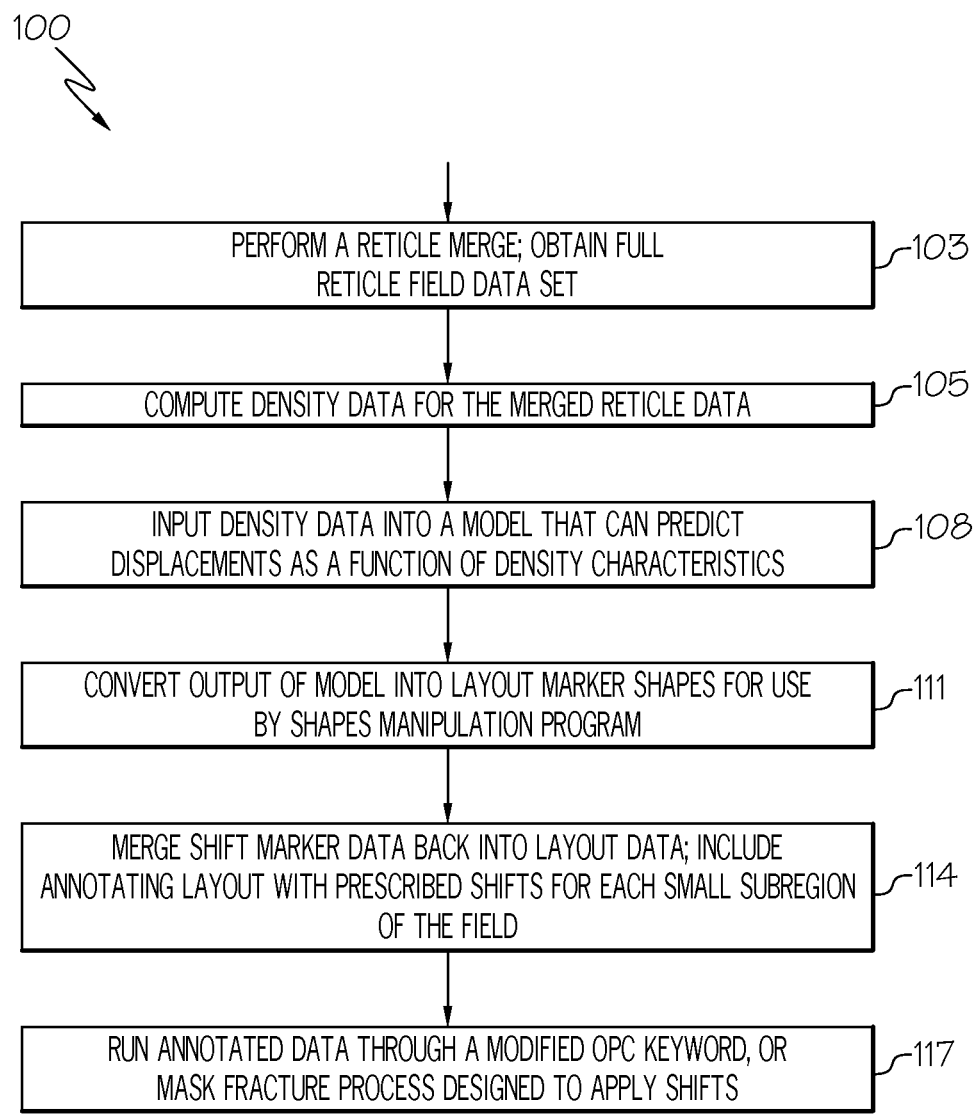
FIG. 2 shows a method 100 for determining compensation of overlay shift in lithographic mask due to stress-induced pattern shifts in one embodiment.

FIG. 2 shows a correction flow methodology 100 for determining compensation of overlay shift in a lithographic mask due to stress-induced pattern shifts in one embodiment. It is understood that the methods described herein could be applied to any mask tapeout flow with the flow 10 of FIG. 1 being just one example.

Figure 3:
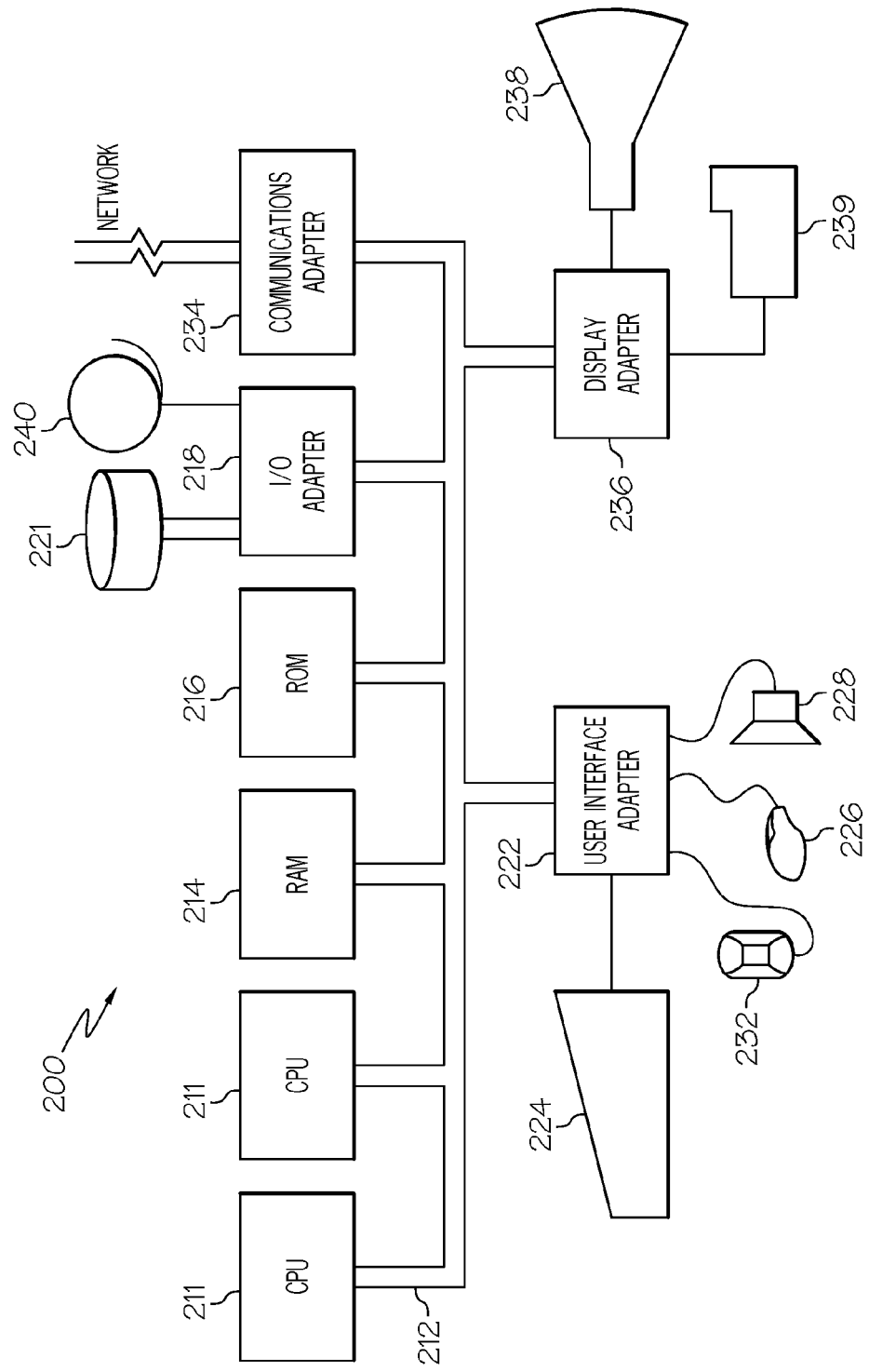
FIG. 3 illustrates an exemplary hardware configuration to run method steps described in FIGS. 1 and 2 in one embodiment.

A first step 103 includes performing a reticle merge to obtain a full reticle field data set. These steps are performed by a computing device(s), such as a computing system having one or more programmed processor devices in a system such as shown in FIG. 3. In one embodiment, the computing system receives the constituent pieces of data that are combined to make a photo mask, and performs a layout data merge to assemble them together into one large dataset. The resultant dataset is used to describe the density characteristics of the photo mask.

The obtained full reticle field data input set for the merge include: data representing the knowledge of the mask assembly plan (e.g., a floor plan showing the planned locations and placements for all of the constituent chiplets, including how the layouts fit together on the mask and what the density characteristics should look like); the data sets associated with chiplets, e.g., taken at the appropriate stage of the data processing flow (e.g., after dummy fill has been placed); and a list of relevant layers. These data sets may be represented in GDS II data formats as known in the industry.

The list of relevant layers data input for obtaining the full the reticle merge include the data levels whose density characteristics drive stress effects. In one embodiment, the data levels that drive the stress effects are the ones that correlate directly to the final features on the wafer. For example, in a Computer-Aided Design (CAD) design space, there may be several of design layers that end up being morphed into "deep trench" features in the silicon wafer during the overall manufacturing process. In one example, the DT shapes become the deep trench capacitors that make up the eDRAM array cells, and also decoupling capacitors. DTFILL (dummy fill) shapes are used in an attempt to make the overall density characteristics as uniform as possible.

Each of these deep trenches (whether electrically functional or not) contributes to the overall stress effects, where the stress contribution is proportional to the number of deep trench shapes in a given area. This is true because the deep trench structures are all very similar when patterned in silicon. In other embodiments, knowledge of how various types of features in a layout contribute to stress would be known and there are known techniques for doing this modeling.

At 103, FIG. 2, these data levels are merged into the full reticle field data set, and in the example provided herein, these include the shapes, e.g., polygons, that go onto a DT mask.

The next step 105, FIG. 2 includes computing a computing a density data for the merged (full) reticle data set. The density is computed on a fairly fine resolution, e.g., on the order 1 μm or smaller. The density data computed for the merged reticle data is a standard type of computation that is available in electronic design automation (EDA) software tools providing code that performs these calculations. As an example, a current formula for this calculation may include steps of: picking a "Tile Size", e.g., 1 μm, however other tile sizes larger or smaller are contemplated. Then, writing a grid over the reticle field data on this resolution. Within each example 1 μm×1 μm square, the method then computes the sum of the areas of the shapes of interest, and then divides the result by the area of the square (=1 μm$^2$). For example, if a 1 μm square contains ten 50 nm×50 nm DT shapes in it, then the density of that tile would be $[(10*(0.050^2))/1]=0.025$ which could also be expressed as a 2.5% density.

Density calculations is a standard computation in the semiconductor field (area of shapes divided an area of a unit cell), and most EDA design kits have design rules that stipulate maximum and minimum densities on some levels over larger areas. The present embodiment implements density tiles that require density calculations on small tile sizes, to ensure that the resulting density maps are of very fine resolution.

It is understood that these calculations take into account for the way data is stepped across the field. That is, as a stepper exposes the mask multiple times as a wafer is moved to make the multiple chips, and the tool alternately exposes the reticle field and moves the wafer in a side-stepping fashion, in the final printed wafer the shapes at the reticle field edges may be distorted, with distortions based not only on what is inside the reticle field, but also as a function of a field being wrapped around its sides. The software tool accounts for this distortion of the wafer by essentially taking the neighboring copy of the field into account when computing densities.

In one embodiment, density data can be expressed in American Standard Code for Information Interchange (ASCII) format, where each row of a file include these three fields:

| $x_i$ | $y_i$ | $d_i$ |
|---|---|---|
| ... | ... | ... | where $x_i$ and $y_i$ are the x,y coordinates of the center of the tile "i", e.g., the 1 μm squared region of interest, and the value $d_i$ is the density within that tile "i" (e.g., a value between 0 and 1, or a value ranging between 0 and about 0.2).

For a full reticle field, the resulting ASCII data file is very large. This fine resolution density data format is used because the resulting data needs to be sufficiently detailed in order to capture the shorter range components of the stress effect that is being correct for, and to make sure that the resulting density gradients are relatively "smooth".

Next, at 108, FIG. 2, the density data, e.g., ASCII data file, is used as an input into a model that can predict displacements as a function of density characteristics. Any computer aided stress/strain model that can predict displacements as a function of density could be used in this step. Output of this model includes ASCII data describing predicted x-direction and y-direction shifts for each location in the reticle field (on some fine resolution, sufficiently fine to ensure smooth shift gradients.)

At this step, the modeling of stress induced displacements based on knowledge of density characteristics of layout is used to correct mask data by moving individual shapes in the mask data in a manner to pre-compensate for expected shifts. There are many available model forms used to do this kind of stress displacement calculation. One kind of model form that could be used to compute these kinds of displacements is a finite element model. For example, such a model may implement 3-D finite element simulation techniques which models can involve computationally expensive techniques requiring large amounts of computational resources.

There are many refinements and variations in the field of finite element modeling that can improve the computational feasibility of this kind of computation. Such refinements and variations may include, but are not limited to: the principle of superposition; the use of adaptive meshing; and reducing the three dimensional problem to a simpler two dimensional problem, where the expected stresses and displacements in the Z axis (perpendicular to the wafer plane) can be neglected, resulting in far faster computations.

In other embodiments, other kinds of model forms can be employed given that there is a significant amount of prior art in the field of modeling stress in silicon, and stress induced displacements.

Example techniques that can be used in the model for predicting displacements as a function of density characteristics include techniques such as described a reference to Scott R. Stiffler, et al. entitled *The Effect of Trench Corner Shapes on Local Stress Fields: A Three-Dimensional Finite-Element Modeling Study* in IEEE TRANSACTIONS ON ELECTRON DEVICES, VOL. 40, NO. 3, MARCH 1993, incorporated herein by reference, and a reference to Thuy Dao, et al entitled *Through-Silicon-Via Stress 3D Modeling and Design* in the IEEE International Conference on IC Design & Technology 2010, the content and disclosure of which is incorporated by reference as if fully set forth herein.

As an output of the model, there is provided the predicted shift data in ASCII format. Each line of the file has four fields of numerical values such as:

| $x_i$ | $y_i$ | $Dx_i$ | $Dy_i$ |
|---|---|---|---|
| ... | ... | ... | ... | where $x_i$ and $y_i$ are the x,y coordinates of the center of the tile, e.g., the 1 μm squared region of interest, and $(Dx_i, Dy_i)$ is a stress displacement vector describing the expected stress-induced wafer deformation at $(x_i, y_i)$. An example of such ASCII formatted lines output from a sample predicted shift displacement output file for each location in the reticle field with the x-direction and y-direction values in microns, for example, is shown below:

| 0.500 | 4520.500 | −1.492E−03 | 3.682E−04 |
|---|---|---|---|
| 0.500 | 4521.500 | −1.498E−03 | 3.962E−04 |
| 0.500 | 4522.500 | −1.487E−03 | 4.412E−04 |
| 0.500 | 4523.500 | −1.510E−03 | 3.794E−04 |
| 0.500 | 4524.500 | −1.498E−03 | 4.522E−04 |
| 0.500 | 4525.500 | −1.513E−03 | 4.484E−04 |
| 0.500 | 4526.500 | −1.508E−03 | 4.725E−04 |
| 0.500 | 4527.500 | −1.529E−03 | 4.198E−04 |
| ... | ... | ... | ... |

Continuing to step 111, FIG. 2 there is provided a step of converting the output of the model from step 108 into layout marker shapes that can be used by shapes manipulation software. In one embodiment, the predicted shift ASCII data are converted into layout (i.e., shift) marker data, e.g., in a design tape-out format such as GDS II or OASIS data formats, for use in EDA mask data processing tools. In one embodiment, the layout marker data is converted into a format that OPC software can use and understand for subsequent processing. One method includes the steps of: reading the shift displacement output ASCII data file, one line at a time; rounding off the $Dx_i$ and $Dy_i$ vector components to the nearest nm; and drawing a box, e.g., 1 μm by 1 μm, centered at $(x_i, y_i)$ on two layers, which are designed to communicate the expected $Dx_i$ and $Dy_i$ values. One example embodiment of a marker level naming convention is as follows:

X_SHIFT_P7 which represents an x-shift of Positive 7 nm (i.e. a "DT hole" shift to the right to overcome a negative stress induced displacement); and Y_SHIFT_N17 which represents a y-shift of Negative 17 nm (i.e. a shift downwards to overcome an upward stress induced displacement).

Generally, at this step the ASCII data may be converted into a format (e.g. OASIS) such as by implementing multi-threading and parallelization techniques to speed up the conversion of a large ascii file into layout format.

In one example embodiment, the steps of rounding off the $Dx_i$ and $Dy_i$ vector components to the nearest nm; and drawing a box centered at $(x_i, y_i)$ on two layers—involves, for each tile at the chosen granularity)—1) reading from the model, the $x_i$, $y_i$ and $Dx_i$ and $Dy_i$ values; and, as a convenience in converting these values to layers for use in deriving a "smooth" correction map for the layout, 2) rounding off of the $Dx_i$ and $Dy_i$ values, e.g., to the nearest nanometer, and 3) sorting and placing the rounded off values in discrete buckets ("bins"). As part of this "binning" process, wherein the $Dx_i$ and $Dy_i$ values are converted to layers, rounded off and sorted into discrete buckets, the method further performs labeling all of the regions of chip having the same shift with a special marker level. For example, all chip cells having an X-shift of 1 nm, 2 nm (or any granularity larger or smaller) as appropriate will have a special marker level (created from the rounded $Dx_i$ and $Dy_i$ values), and these is to be added as a layer to be added to the layout data. For example, wherein all regions on the chip are labeled to have a computed shift, e.g., of 1 nm, the special marker labeling taking a form such as, e.g., X_SHIFT_P1 (where P is positive shift direction and 1 is nanometer) to be added to the design layout data, X_SHIFT_P2 for a 2 nm shift etc.

Returning to FIG. 2, continuing at step 114, there is performed the step of merging the special shift marker data back into layout data, annotating the layout data with prescribed shifts in the converted marker level form, e.g., X_SHIFT_P1, X_SHIFT_N1, etc. . . . added to the OASIS or GDS II data format for each small sub-region of the field (e.g., 1 μm unit square).

Finally, at 117, FIG. 2 there is performed the step of running annotated data through a modified OPC recipe, or mask fracture process designed to apply shifts, e.g., where post-OPC data is converted to a format that an e-beam mask writer can use to write the photo mask.

Referring back to FIG. 1, step 50, then an Optical Proximity Correction process can be modified from a traditional OPC recipe to do an additional step to move the center-lines of individual mask shapes (i.e., individual polygons in mask data) to compensate for localized overlay errors; and more specifically: moving center-lines of mask shapes (e.g., moving the centroids of individual polygons on a mask) to compensate for overlay errors caused by the stress-induced silicon distortion at all within-field length scales.

The pre-processing method 100 of FIG. 2 implemented in the flow 10 of FIG. 1, is applied, in one embodiment, to correct for stress is by shifting the mask shapes as one of the last steps in an OPC recipe although it could be applied to designed shapes prior to the OPC process. Applying the shifts after OPC avoids significant computational cost due to destruction of layout hierarchy incurred by applying the shifts before entering the OPC engine. In the approach described herein the correction overlay map is computed on a sufficiently fine resolution to drive "smooth" shift corrections, where neighboring polygons always get very similar shifts (or identical shifts) as facilitated by the layer "binning" process described herein above.

It should be understood that the shifting of individual printed shapes is applied to compensate for overlay registration errors caused by a measured or predictable systematic within field pattern distortion.

In further embodiments, the method that includes pre-shifting is performed such that shapes move to their ideal designed target after printing and subsequent distortion.

In a further embodiment, shapes are shifted to compensate for alignment errors to an already distorted pre-existing layer.

In further embodiment, the pattern distortion is predicted by direct measurements or, may be using the predictive model described herein above. In one aspect, the systematic pattern distortion is caused by non-uniform stress changes within the printed structure, or the systematic pattern distortion is caused by stress non-uniform stress changes within a mask. Alternately, the systematic pattern distortion is created by the lens or other part of a lithographic projection system. For example, any lens distortion measurement known in the art can be used for this purposes.

It is the case that multiple masks in a sequence may need to be modified to adjust. To adjust and compensate for the corrections to those masks, two options are used. For example, given an image set comprising a set of photo masks used in a sequence, the set comprising: $Mask_1$, $Mask_2$, . . . , $Mask_N$, $Mask_{N+1}$, . . . , $Mask_{LAST}$ if there is a process that introduces within field distortions between masks $Mask_N$ and $Mask_{N+1}$, then to compensate for this distortion it would need to be ensured that all masks in the sequence are corrected appropriately so that all their shapes align.

In a first option: all $Mask_1$ through $Mask_N$ are corrected in a way that they pre-shift all their shapes such that the distortion that occurs then moves them back to their desired (undistorted) location. In a second option, all masks $Mask_{N+1}$ through $Mask_{LAST}$ are corrected in a manner that all their shapes are moved by the same amount as the distortion introduced in the masks $Mask_1$ through $Mask_N$.

Referring now to FIG. 3, there is illustrated an exemplary hardware configuration of a computing system infrastructure 200 in which the present methods depicted in FIGS. 1, 2 are run. In one aspect, computing system 200 receives or accesses the data from a memory storage device such as a database, and is programmed with method instructions to perform the steps of FIG. 2. The hardware configuration preferably has at least one processor or central processing unit (CPU) 211. The CPUs 211 are interconnected via a system bus 212 to a random access memory (RAM) 214, read-only memory (ROM) 216, input/output (I/O) adapter 218 (for connecting peripheral devices such as disk units 221 and tape drives 240 to the bus 212), user interface adapter 222 (for connecting a keyboard 224, mouse 226, speaker 228, disk drive device 232, and/or other user interface device to the bus 212), a communication adapter 234 for connecting the system 200 to a data processing network, the Internet, an Intranet, a local area network (LAN), etc., and a display adapter 236 for connecting the bus 212 to a display device 238 and/or printer 239 (e.g., a digital printer of the like).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of reducing overlay errors during a semiconductor photolithographic mask design process flow, said method comprising:
    obtaining data representing density characteristics of a photo mask layout design by merging pieces of data that are combined to obtain a full reticle field data set, said merging including merging of data representing density characteristic driven stress effects; and obtaining density characteristics data for the merged reticle data set;

predicting stress induced displacements based on said obtained density characteristics data; and correcting the mask layout design data by specifying shift movement of individual photo mask design shapes to pre-compensate for predicted displacements, wherein a programmed hardware processor performs said obtaining, stress predicting and mask layout design correcting.

2. The method of claim 1, wherein said predicting comprises:

inputting said density characteristics data into a programmed model for predicting displacements as a function of density, said model outputting predicted shift data.

3. The method of claim 2, wherein said predicted shift data is in an ASCII format, said correcting the mask layout design data comprises:

converting said predicted shift data in said ASCII format into a layout marker data; and merging said predicted shift marker data back into said mask layout design data by annotating said mask layout design data with said predicted shifts for a determined sub-region of a reticle field.

4. The method of claim 3, further comprising:

using the annotated mask layout design data with said predicted shifts in an optical proximity correction process designed to apply said shifts.

5. The method of claim 3, further comprising:

using the annotated mask layout design data with said predicted shifts in a mask fracture process designed to apply said shifts.

6. The method of claim 1, wherein said specifying shift movement of individual shapes includes:

pre-shifting individual printed shapes to compensate for overlay registration errors caused by one of: a measured or predictable systematic within reticle field pattern distortion.

7. The method of claim 6, wherein the pattern is on a lithographic mask.

8. The method of claim 6, wherein the systematic within reticle field pattern distortion is one or more of: in the mask or is on a semiconductor wafer.

9. The method of claim 6, where said pre-shifting is:

applied to designed shapes prior to optical proximity correction process designed to apply said shifts; or applied as small increments between shapes and applied to post optical proximity correction mask data.

10. A system for designing semiconductor photolithographic masks comprising:

a memory storage device;

a hardware processor, coupled to said memory storage device, for receiving instructions therefrom to configure said hardware processor to perform a method comprising:

obtaining data representing density characteristics of a photo mask layout design by merging pieces of data that are combined to obtain a full reticle field data set, said merging including merging of data representing density characteristic driven stress effects; and obtaining density characteristics data for the merged reticle data set;

predicting stress induced displacements based on said obtained density characteristics data; and correcting the mask layout design data by specifying shift movement of individual photo mask design shapes to pre-compensate for predicted displacements.

11. The system of claim 10, wherein to predict, said hardware processor is further configured to:

input said density characteristics data into a programmed model for predicting displacements as a function of density, said model outputting predicted shift data.

12. The system of claim 11, wherein said predicted shift data is in an ASCII format, and to correct the mask layout design data, said hardware processor is further configured to:

convert said predicted shift data in said ASCII format into a layout marker data; and merge said predicted shift marker data back into said mask layout design data by annotating said mask layout design data with said predicted shifts for a determined sub-region of a reticle field.

13. The system of claim 12, wherein said hardware processor is further configured to:

use the annotated mask layout design data with said predicted shifts in an optical proximity correction process designed to apply said shifts.

14. The system of claim 12, wherein said hardware processor is further configured to:

use the annotated mask layout design data with said predicted shifts in a mask fracture process designed to apply said shifts.

15. The system of claim 10, wherein to specify shift movement of individual shapes, said hardware processor is further configured to:

pre-shift individual printed shapes to compensate for overlay registration errors caused by one of: a measured or predictable systematic within reticle field pattern distortion.

16. A computer program product comprising:

a computer readable storage device, said device tangibly embodying a program of instructions executable by the computer for reducing overlay errors during a semiconductor photolithographic mask design process flow, said program of instructions, when executing, performing:

obtaining data representing density characteristics of a photo mask layout design by merging pieces of data that are combined to obtain a full reticle field data set, said merging including merging of data representing density characteristic driven stress effects; and obtaining density characteristics data for the merged reticle data set;

predicting stress induced displacements based on said obtained density characteristics data; and correcting the mask layout design data by specifying shift movement of individual photo mask design shapes to pre-compensate for predicted displacements.

17. The computer program product as claimed in claim 16, wherein said predicting comprises:

inputting said density characteristics data into a programmed model for predicting displacements as a function of density, said model outputting predicted shift data.

18. The computer program product as claimed in claim 17, wherein said predicted shift data is in an ASCII format, said correcting the mask layout design data comprises:

converting said predicted shift data in said ASCII format into layout marker data; and merging said predicted shift marker data back into said mask layout design data by annotating said mask layout design data with said predicted shifts for a determined sub-region of a reticle field.

19. The computer program product as claimed in claim 18, further comprising:
    using the annotated mask layout design data with said predicted shifts in an optical proximity correction process designed to apply said shifts.

20. The computer program product as claimed in claim 18, further comprising:
    using the annotated mask layout design data with said predicted shifts in a mask fracture process designed to apply said shifts.

21. A method of reducing errors during a semiconductor photolithographic mask design process flow, said method comprising:
    obtaining data representing distortions to a photo mask design produced by components of a photolithographic system, said data including a full reticle field data set obtained by merging pieces of data that are combined to make a photo mask, said merging including a merge of data representing density characteristic driven stress effects which cause pattern distortions within a mask;
    computing displacements of features on said photo mask design based on said obtained distortion data; and
    correcting the mask layout design data by specifying shift movement of individual photo mask design shapes to pre-compensate for predicted displacements,
    wherein a programmed hardware processor performs said obtaining, predicting and mask layout design correcting.

* * * * *